United States Patent [19]

Harkin

[11] Patent Number: 5,621,374
[45] Date of Patent: Apr. 15, 1997

[54] AMPLIFYING CIRCUIT FOR SIMULATING A UNITY GAIN BUFFER AMPLIFIER

[75] Inventor: Gerard F. Harkin, London, England

[73] Assignee: U.S. Philips Corporation, New York, N.Y.

[21] Appl. No.: 573,168

[22] Filed: Dec. 15, 1995

[30] Foreign Application Priority Data

Dec. 20, 1994 [GB] United Kingdom ............... 9425714

[51] Int. Cl.⁶ ............................. H03F 1/56; H03F 3/45
[52] U.S. Cl. ......................... 337/151; 330/253; 330/295
[58] Field of Search ............................ 330/69, 124 R, 330/151, 252, 253, 260, 295

[56] References Cited

U.S. PATENT DOCUMENTS 2,852,625  9/1958  Nuut ................................... 330/151 X

FOREIGN PATENT DOCUMENTS

0523796A1  1/1993  European Pat. Off. .
2158665   11/1985  United Kingdom ............. H03F 1/34

OTHER PUBLICATIONS

IEEE Journal of Solid State Circuits, SC-14, No. 6, Dec. 1979, pp. 1070-1077.
IEEE Journal of Solid State Circuits, SC-11, No. 6, Dec. 1976, pp. 748-753.
IEEE Journal of Solid State Circuits SC-14, No. 6, Dec. 1979, pp. 1111-1114.

Primary Examiner—James B. Mullins
Attorney, Agent, or Firm—Bernard Franzblau

[57] ABSTRACT

An amplifying circuit includes a low gain amplifier having positive and negative inputs and an output. A high impedance path provided by, for example, a low gain unity buffer amplifier feeds from the negative input to the output of the amplifier a first voltage ($KV^+$) equal to a second voltage ($V^+$) at the positive input of the amplifier multiplied by the reciprocal of the open loop gain ($A_{OL}$) of the amplifier. This circuit simulates a unity gain buffer amplifier having a high input impedance and a high open loop gain using a low open loop gain amplifier and a feed forward arrangement. The use of a low gain amplifier avoids the need for large area transistors and the resultant large parasitic capacitances and so facilitates high speed operation.

20 Claims, 2 Drawing Sheets

AMPLIFYING CIRCUIT FOR SIMULATING A UNITY GAIN BUFFER AMPLIFIER

BACKGROUND OF THE INVENTION

This invention relates to an amplifying circuit, especially an amplifying circuit suitable for implementation in NMOS technology.

It is relatively simple to design amplifying circuits having high gain where a complementary transistor technology is available. There are, however, circumstances where it is desirable to use only one conductivity type of transistor, for example, in circumstances where it is technologically difficult to form complementary transistors. As indicated in a paper entitled "A High Performance All-Enhancement NMOS Operation Amplifier" by I A Young published in the IEEE Journal of Solid-State Circuits, Vol SC-14, No 6, December 1979 at pages 1070 to 1077 and a paper entitled "An Integrated NMOS Operational Amplifier with Internal Compensation" by Y P Tsividis and P R Gray published in the IEEE Journal of Solid-State Circuits, Vol SC-11, No 6 December 1976 at pages 748 to 753, when only enhancement mode NMOS transistors of one conductivity type, generally n conductivity type, are available, the gain obtained for each amplifier stage is to a first order dependent on the square root of the ratio between the conduction channel width/length (W/L) ratio of the input NMOS transistor to that of the load NMOS transistor. Accordingly, to achieve high gain in an amplifying stage a large area input or driver transistor is required which inevitably results in a large parasitic capacitance. The overall gain of the amplifying circuit may be increased by using a number of amplifier gain stages as described in the aforementioned papers, but this inevitably increases the area required by the amplifying circuit and, moreover, makes the use of frequency compensation capacitors necessary.

The use of a form of boot-strapping, as described by, for example, B J Hosticka in a paper entitled "Improvement of the Gain of MOS Amplifiers" Published in the IEEE Journal of Solid Circuits, Vol SC-14, No 6, December 1979, pages 1111–1114 may be helpful but it may still be necessary to provide many gain stages to provide a reasonable open loop or small signal gain.

SUMMARY OF THE INVENTION

It is an aim of the present invention to provide an amplifying circuit which overcomes or at least mitigates the above-mentioned problems.

According to the present invention, there is provided an amplifying circuit comprising an amplifier having positive and negative inputs and an output and means providing a high input impedance path for feeding from the negative input to the output of the amplifier a first voltage equal to a second voltage at the positive input of the amplifier multiplied by the reciprocal of the open loop gain of the amplifier.

The present invention thus enables the formation of an amplifying circuit that can simulate a unity gain buffer amplifier having a high input impedance and high open loop or small signal gain using a low open loop gain amplifier which facilitates fast operation of the amplifying circuit and which, being of low open loop gain, does not require large area transistors. Moreover, such an amplifying circuit may be implemented using only one type of transistor, for example, n-channel enhancement mode insulated gate field effect transistors (NMOS transistors).

The feeding means may comprise a further amplifier having positive and negative inputs and an output with the positive input being coupled to the positive input of the amplifier, and the negative input being coupled to the output of the further amplifier which output is coupled via coupling means to supply the first voltage to the output of the amplifier. The amplifier may, for example, have an open loop or small signal gain of 2 and the further amplifier an open loop gain of 1, so enabling the use of very small area transistors. The use of a further amplifier which may also have a low open loop or small signal gain enables the feeding means to have a very high input impedance yet occupy a relatively small area. As another possibility, a very high value resistor could be used although such a resistor would generally not provide as high an input impedance as the further amplifier and would probably have to occupy a large area, that is be very long and thin, to achieve a sufficiently high resistance.

The coupling means may comprise first and second matched transistors each having first and second main electrodes and a control electrode with the main current paths between the first and second main electrodes of the first and second transistors being coupled in series, the control electrode of the first transistor being coupled to the output of the further amplifier and the control electrode of the second transistor being coupled to the output of the amplifier.

The or each amplifier may comprise a single stage amplifier, for example a single stage long tailed pair, because the or each amplifier need only have a low open loop gain. This allows there to be only one pole and should avoid the need for frequency compensation capacitors.

The or each amplifier may comprise a first arm having a first input transistor having a first main electrode coupled via a first load to a first voltage supply line, a second main electrode and a control electrode coupled to the positive input of the amplifier and a second arm having a second input transistor having a first main electrode coupled via a second load to the first voltage supply line, a second main electrode and a control electrode coupled to the negative input of the amplifier, the second main electrodes of the input transistors being coupled to one of the first and second main electrodes of a bias transistor having its other main electrode coupled to a second voltage supply line and its control electrode coupled to a bias voltage supply line, the output of the amplifier being coupled between the second load and the first main electrode of the second input transistor. The first and second loads may be diode-connected transistors.

The amplifying circuit may be formed as a thin film integrated circuit. The transistors may be n-channel enhancement mode insulated gate field effect transistors (IGFETs). The amplifying circuit could, however, be formed using p-channel enhancement mode IGFETs. As another possibility, the amplifying circuit may be implemented in CMOS technology to provide, by virtue of the fact that only low open loop gain amplifiers and thus small area transistors are required, a CMOS amplifying circuit simulating a high speed high gain unity buffer amplifier.

BRIEF DESCRIPTION OF THE DRAWINGS

Embodiments of the present invention will now be described, by way of example, with reference to the accompanying drawings, in which:

FIG. 5 illustrates one embodiment of an amplifying circuit in accordance with the invention.

It should of course be understood that the drawings are not to scale and that like reference numerals are used throughout text to refer to like parts.

DESCRIPTION OF THE PREFERRED EMBODIMENTS

Figure 1:
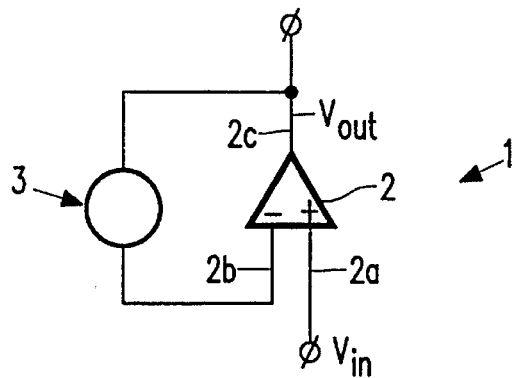
FIG. 1 shows a circuit block diagram of an amplifying circuit in accordance with the invention.

Referring now to the drawings, for example FIG. 1, there is shown an amplifying circuit 1 comprising an amplifier 2 having positive 2a and negative inputs 2b and an output 2c and means 3 providing a high input impedance path for feeding from the negative input 2b to the output 2c of the amplifier 2 a first voltage $KV^+$ equal to a second voltage $V^+$ at the positive input 2a of the amplifier 2 multiplied by the reciprocal of the open loop gain $A_{OL}$ of the amplifier.

Such an amplifying circuit simulates a unity gain buffer amplifier having a high input impedance and a high open loop gain using a low open loop gain amplifier and a feed forward means. The use of a low gain amplifier avoids the need for large area transistors and the resultant large parasitic capacitances and so facilitates high speed operation.

Referring now specifically to the simplified block schematic diagram shown in FIG. 1, the voltage relationship between the inputs 2a and 2b and the output 2c of the amplifier 2 is given by:

$$V_{OUT} = A_{OL}(V^+ - V^-) \quad (1)$$

where $V_{OUT}$ is the voltage at the output 2c of the amplifier, $V^+$ is the voltage at the positive 2a of the amplifier and $V^-$ is the voltage at the negative input 2b of the amplifier. $A_{OL}$ is the open loop or small signal gain of the amplifier 2 which for a differential input operational amplifier may be defined as the ratio between the change of the output voltage and the change of the input voltage ($\Delta V_{OUT}/\Delta V_{IN}$) with the input voltage being that measured directly between the inverting (negative) and non-inverting (positive) inputs of the amplifier.

As shown in FIG. 1 a first voltage $KV^+$ is fed from the negative input 2b to the output 2c of the amplifier 2 and accordingly the following equality must hold:

$$V^- V_{OUT} = KV^+ \quad (2)$$

Substituting into equation 1 for $V^-$ gives:

$$V_{OUT} = A_{OL}(V^+ - V_{OUT} + KV^+) \quad (3)$$

and solving for $V_{OUT}$ in terms of $V^+$ gives:

$$V_{OUT}(1+A_{OL}) = A_{OL}V^+(1+K) \quad (4)$$

So that the output voltage $V_{OUT}$ is given by:

$$V_{OUT} = \frac{A_{OL}V^+(1+K)}{(1+A_{OL})} \quad (5)$$

The ratio of the output voltage $V_{OUT}$ to the voltage $V^+$ at the positive input 2a of the amplifier is thus:

$$\frac{V_{OUT}}{V^+} = \frac{A_{OL}(1+K)}{(1+A_{OL})} \quad (6)$$

Accordingly, the value of K can be selected to provide the desired ratio between the output voltage $V_{OUT}$ and the input voltage $V^+$. Thus, to provide a unity gain buffer amplifying circuit, then the following relationship should hold:

$$K = \frac{1}{A_{OL}} \quad (7)$$

Figure 2:
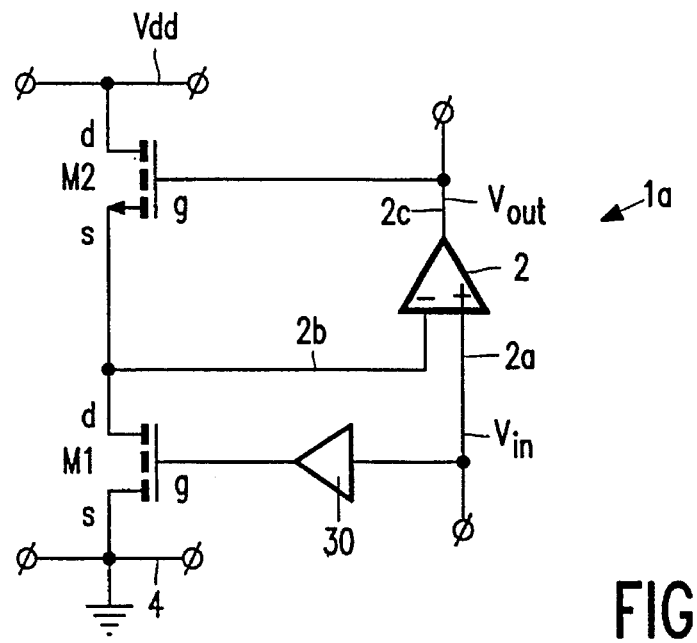
FIG. 2 shows a more detailed circuit block diagram of an amplifying circuit in accordance with the invention.

FIG. 2 shows an amplifying circuit 1a using one possible way of feeding the first voltage from the negative input 2b to the output 2c of the amplifier 2 to provide a unity gain buffer amplifying circuit. In the example shown in FIG. 2, the feeding means 3 comprises a further low open loop gain amplifier 30 coupled between the positive input 2a of the amplifier 2 and the control gate g of a first transistor M1. One electrode s of the first and second main electrodes of the first transistor M1 is coupled to a reference voltage supply line 4, generally earth (ground) while the other electrode d of the first and second main electrodes of the transistor M1 is coupled to the negative input 2b of the amplifier 2 and to one electrode s of the first and second main electrodes of a second transistor M2. The other electrode d of the first and second main electrodes of the second transistor M2 is coupled to a voltage supply line $V_{dd}$. The control electrode g of the second transistor M2 is coupled to the output 2c of the amplifier 2.

The first and second transistors M1 and M2 are n-channel enhancement mode insulated gate field effect transistors (IGFETs) and are matched, that is their channel width to length ratios W/L are the same.

The transistors M1 and M2 operate in their saturation region and accordingly, assuming the channel length modulation factor is small, the transistors M1 and M2 will have the same gate-source voltages $V_{gs}$.

The gate-source voltage $V_{gs1}$ of the first transistor M1 is determined by the further amplifier 30 and, by virtue of the coupling to the positive input 2a of the amplifier 2, the voltage at the control gate g of the first transistor M1 will increase with the input voltage $V^+$ at the positive input 2a of the amplifier 2. Because the second transistor M2 is matched to the first transistor M1, its gate source $V_{gs2}$ will increase by the same amount and accordingly as the input voltage $V^+$ increases, the difference between the output voltage $V_{OUT}$ and the voltage at the negative input 2b of the amplifier 2 (which is the gate source voltage $V_{gs2}$ of the second transistor M2) will increase by the same amount. Thus, the use of two matched or identical transistors M1 and M2 in series causes the difference between the output voltage $V_{OUT}$ and the voltage $V^-$ at the negative input 2b of the amplifier 2 to be dependent on the input voltage $V^+$ at the positive input 2a of the amplifier with the actual dependence being determined by the further amplifier 30.

As will be appreciated from the above, for the amplifying circuit 1a shown in FIG. 2 to operate as a unity gain buffer amplifying circuit, then the further amplifier 30 will be arranged to supply an output voltage equal to $V^+/A_{OL}$, where $A_{OL}$ is the open loop gain of the amplifier 2. For example, if the amplifier 2, has an open loop gain of 2 then the amplifier 30 will be arranged to supply an output voltage $V^+/2$ whereas if the open loop gain of the amplifier 2 is 3, then the amplifier 30 will be arranged to supply an output voltage of $V^+/3$ and so on.

Figure 3:
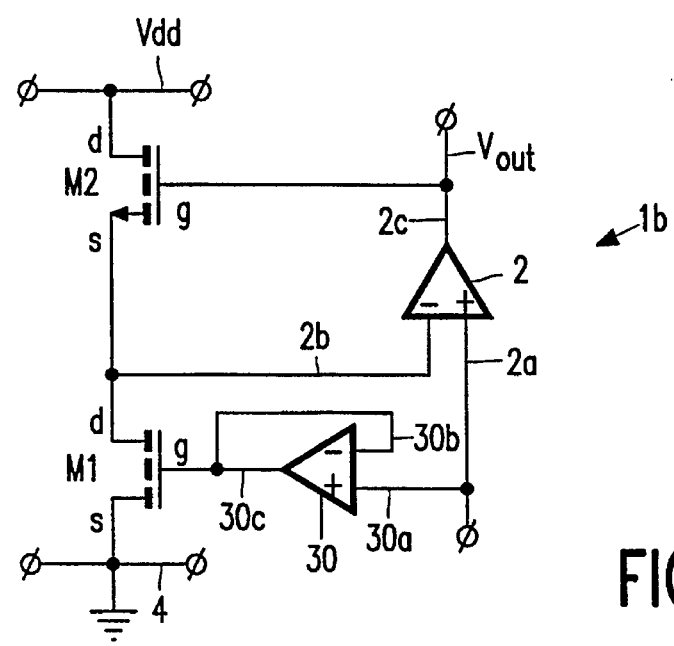
FIG. 3 shows a circuit block diagram of one example of an amplifying circuit in accordance with the invention.

FIG. 3 illustrates an example of an amplifying circuit 1b in which the further low gain amplifier 30 has positive and negative inputs 30a and 30b with its positive input 30a coupled to the positive input 2a of the amplifier 2 and its negative input 30b coupled to its output 30c, which is coupled to the gate or control electrode g of the transistor M1. This further low gain amplifier 30 is thus coupled as a unity gain buffer amplifier for which the following relationship holds:

$$\frac{KV^+}{V^+} = \frac{V_{OUT(30)}}{V_{IN(30)}} = \frac{A_{OL}'}{1+A_{OL}'} \quad (8)$$

where $V_{IN(30)}$ and $V_{OUT(30)}$ are the input and output voltages of the unity gain buffer amplifier 30 and $A'_{OL}$ is the open loop small signal gain of the amplifier 30.

Rearranging to solve for $A'_{OL}$ gives:

$$A_{OL}' = \frac{V_{OUT(30)}}{V_{IN(30)} - V_{OUT(30)}} \quad (9)$$

and dividing top and bottom of the right hand side by $V_{IN(30)}$ gives:

$$A_{OL}' = \frac{K}{1-K} \quad (10)$$

Accordingly, if the open loop gain $A_{OL}$ of the amplifier 2 is 2 then $K=\frac{1}{2}$ and the further amplifier 30 should be arranged to have an open loop gain of 1 so as to divide its input signal $V^+$ by two. Similarly if $A_{OL}=3$ then $K=\frac{1}{3}$ and $A'_{OL}$ will equal $\frac{1}{2}$ and if $A_{OL}=4$ then $K=\frac{1}{4}$ and $A'_{OL}$ will equal $\frac{1}{3}$ and so on.

The use of the further low gain amplifier 30 to obtain the given constant or scaling factor K enables the formation of an amplifying circuit 1b having a high input impedance and in which the output voltage $V_{OUT}$ should track the input voltage $V^+$ almost perfectly. Although a resistive potential divider could be used to obtain the first voltage $KV^+$, that would have the disadvantage, unless a very high resistance and therefore very long and thin resistor is used, of reducing the input impedance of the circuit and would not be desirable where the amplifying circuit 1a is to be used as a unity gain buffer amplifying circuit. In contrast the use of the further low gain amplifier 30 enables the feeding means to have a very high input impedance and yet occupy a relatively small area.

Figure 4:
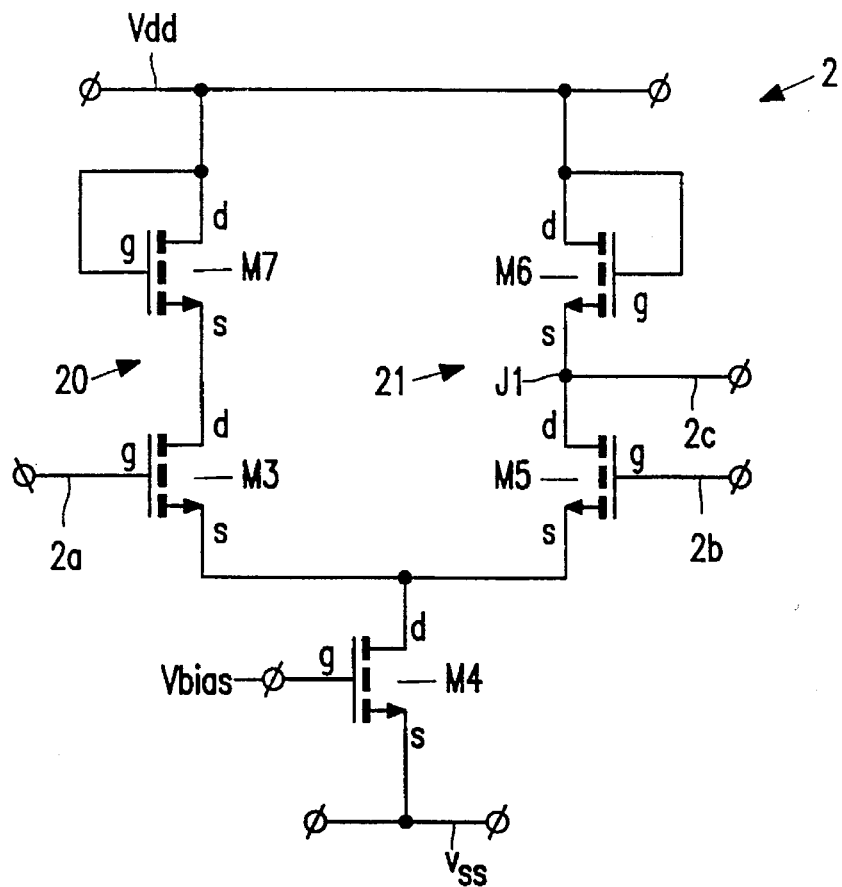
FIG. 4 shows one example of a single stage long tailed pair amplifier suitable for use in an amplifying circuit in accordance with the invention.

FIG. 4 illustrates one example of a single stage amplifier which may be used to form the amplifier 2 shown in FIG. 3.

As shown in FIG. 4, the amplifier 2 or 30 comprises a long-tailed pair. As shown, the two arms 20 and 21 of the long-tailed pair are identical. Thus, in the example shown in FIG. 4, the first arm 20 of the amplifier 2 comprises an n-channel enhancement mode IGFET or transistor M3 having its drain electrode d coupled via a first load device M7 to a voltage supply line Vdd and its source electrode s coupled to the drain electrode of an n-channel enhancement mode bias IGFET M4, while the other arm 21 of the amplifier 2 comprises a second input n-channel enhancement mode IGFET or transistor M5 having its drain electrode d coupled to the voltage supply line Vdd via a second load device M6. In the example shown, the first and second load devices comprise diode-connected n-channel enhancement mode IGFETS M7 and M6. However, any suitable form of load, even a passive load such as a resistor, may be used.

The other main electrode s of the second input IGFET M5 is coupled to the drain electrode d of the bias IGFET M4. The other main electrode s of the bias IGFET M4 is coupled to a reference voltage supply line Vss, generally earth (ground), while the control or gate electrode g of the bias IGFET M4 is coupled to an appropriate bias voltage Vbias. The positive voltage input 2a of the amplifier 2 is coupled to the control or gate electrode of the first input IGFET M3 while the negative voltage input 2b of the amplifier 2 is coupled to the control or gate electrode of the second input transistor M5. A single output $V_{OUT}$ is taken from the amplifier at a junction J1 between the source electrode of the load IGFET M6 and the drain electrode of the second input IGFET M5.

Although the differential amplifier shown in FIG. 4 is symmetric, an asymmetric structure, that is a differential amplifier in which the first load device is omitted from first arm 20 could be used. As described in relation to, for example, FIG. 3 of a paper by Asad A Abidi published in the IEEE Journal of Solid-State Circuits in Vol 23, No 6, December 1988, at pages 1434 to 1437, such an asymmetric differential amplifier structure has a gain which may be as much as twice that of the equivalent symmetric differential amplifier structure.

As indicated in the aforementioned paper by Yannis Tsividis and Paul Gray, the differential gain Gd of the differential amplifier shown in FIG. 4 would be $$Gd = \frac{gm3}{gm7} = \sqrt{\frac{\frac{W}{L}(M3)}{\frac{W}{L}(M7)}} \quad (11)$$

where gm3 and gm7 are the transconductances of the transistors M3 and M7 (the transistor M5 is, of course, matched with the transistor M3 and the transistor M6 is matched with the transistor M7).

In the present case, however, only a single output $V_{OUT}$ is being taken and accordingly the small signal gain of the amplifier shown in FIG. 4 will be half the differential gain Gd.

It will be seen from the above that for the single stage symmetric differential amplifier shown in FIG. 4 to provide a small signal or open loop gain of 2, then the conduction channel width to length ratio W/L of the driver or input transistors M5 and M3 should be sixteen times that of the load transistors M6 and M7. To achieve an open loop gain of 1 then the conduction channel width to length W/L ratio of the driver or output transistors M5 and M3 should be four times that of the load transistors M6 and M7. It will thus be appreciated that selecting the open loop gain $A_{OL}$ of the amplifier 2 to be 2 and so requiring the open loop gain $A'_{OL}$ of the amplifier 30 to be 1 keeps the driver transistors small and enables only a small area to be occupied by the amplifying circuit.

FIG. 5 illustrates a circuit diagram of an amplifying circuit 1c in which the amplifier 2 and also the further amplifier 30 have the structure shown in FIG. 4 but with the appropriate W/L ratios between the driver and load transistors to achieve the required open loop gains. The transistors forming the differential amplifier 30 are labelled as M3', M4', M5', M6' and M7' to distinguish them from the corresponding transistors M3 to M7 of the differential amplifier 2.

Although the low gain amplifiers 2 and 30 are shown as single stage amplifiers, it may be possible to supply both the positive and negative outputs of a conventional differential amplifier to a differential single ended converter to achieve the required single output. The amplifying circuits 1, 1a, 1b and 1c may be implemented using only enhancement mode IGFETs of one conductivity type, n conductivity type in the example given, and yet may still form high performance unity gain buffer amplifiers with very high input impedances and gains using only low open loop gain amplifiers, which means that the amplifying circuits should be capable of high speed operation and should not require frequency compensation capacitors.

Moreover, the circuit shown in FIG. 5 requires only about ten transistors or IGFETS and accordingly should not occupy a great deal of area. In addition, as indicated above, the individual transistors do not require large W/L ratios to provide an amplifying circuit having a high open loop or small signal gain.

As indicated above, an amplifying circuit in accordance with the invention is particularly advantageous for use in those circumstances, where, for practical reasons, only one conductivity type, generally n conductivity type, of transistor or IGFET may be used. Accordingly, such an amplifying circuit may be particularly advantageous in analogue applications, for example, smart power or power integrated circuits where the integration of a power semiconductor device of one conductivity type with logic circuitry in the same substrate may make it difficult to incorporate logic devices of the opposite conductivity type without experiencing undesired parasitic bipolar effects and without having to resort to a complicated isolation structure.

Figure 6:
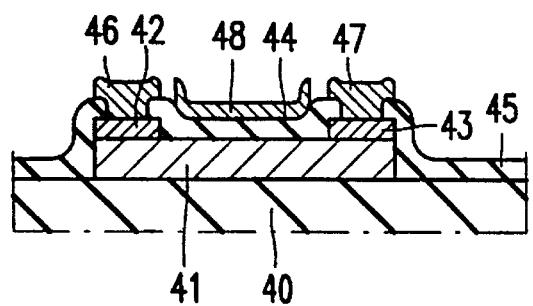
FIG. 6 shows a cross-sectional view through one example of a transistor suitable for use in forming an amplifying circuit in accordance with the invention.

Another instance where such an amplifying circuit may have particular advantages is in the area of thin film technology where it may be difficult to form p-channel IGFETs with the desired performance characteristics. Any suitable form of thin film IGFET structure may be used. Thus, for example, the thin film transistors may be co-planar transistors, that is the gate, drain and source electrodes may be formed on the same surface or the thin film transistors may have a staggered or inverted structure. FIG. 6 shows a cross-sectional view through part of a substrate 40 on which an amplifying circuit in accordance with the invention is integrated. FIG. 6 shows a typical staggered structure suitable for one of the transistors used within the amplifying circuits described above.

As shown in FIG. 6, an amorphous or polycrystalline semiconductor, generally silicon, layer is deposited on to the insulative substrate 40 and patterned to define the conduction channel region 41 of the transistor M1. If considered desirable, n conductivity type doped source and drain contact regions 42 and 43 may be provided at opposite ends of the conduction channel region 41 to ensure good ohmic contact to the subsequent metallisation. An insulating layer, generally silicon oxide or silicon nitride is deposited over this structure to define the gate insulating region 44 and also surrounding insulation 45. Contact holes are formed through the insulating layer 44, 45 and metallisation then is deposited and patterned to define source and drain electrodes 46 and 47 and a gate or control electrode 48. This metallisation may also be patterned to define the appropriate connections between the various transistors forming the amplifier circuit.

Such a thin film technology amplifying circuit may be particularly suitable for use in the driver circuitry for two dimensional active matrix addressed arrays such as image sensors or liquid crystal display devices as described in European Patent Application Publication No 0523796. For example, an amplifying circuit in accordance with the invention may be used in a sample/hold circuit for use in, for example, an integrated column driver for an LCD display. Of course, an amplifying circuit in accordance with the invention may be suitable for use in other situations where a buffer between an input and an output is required.

The following Table 1 shows how changes in the open loop gain $A_{OL}$ of the amplifier 2 and the pre-determined factor K (which is set by the amplifier 30 in the examples given above) affect the ratio between $V_{OUT}$ and $V^+$. Table 1 also shows the equivalent open loop gain $A_{OL(EQ)}$ for the amplifying circuit which can be written as given below:

$$A_{OL(EQ)} = \frac{\frac{V_{OUT}}{V^+}}{1 - \frac{V_{OUT}}{V^+}} \quad (12)$$

Because the transfer function for a unity gain buffer amplifier is given by:

TABLE 1

| | $\frac{V_{out}}{V^+}$ | $= \frac{A_{OL}}{1 + A_{OL}}$ | (13) |
|---|---|---|---|
| $A_{OL}$ | K | $V_{OUT}/V^+$ | $A_{OL(EQ)}$ |
| 1.6 | 0.5 | 0.923 | 12 |
| 1.8 | 0.5 | 0.964 | 27 |
| 2 | 0.5 | 1 | infinity |
| 2.2 | 0.5 | 1.03 | 34 |
| 2.4 | 0.5 | 1.06 | 17.6 |

The above table shows that if the open loop gain $A_{OL}$ of the amplifier 2 changes from 2 to 1.8, the equivalent open loop gain $A_{OL(EQ)}$ will change from infinity to 27. Accordingly, the open loop gain $A_{OL}$ and the factor K should be very accurate in order to obtain a high equivalent gain.

Thus, although it may be possible to form an amplifying circuit in accordance with the invention from discrete components, it is advantageous for the amplifying circuit to be formed as an integrated structure because integration should enable accurate matching of the IGFETS forming the amplifier forming the circuit and therefore very accurate matching between the open loop gains of the amplifiers 2 and 30 so that $K=1/A_{OL}$ as required.

In the amplifying circuit described above, the amplifier 2 and further amplifier 30 each need to have only a low gain to provide an amplifying circuit with a very high performance and gain. The fact that the amplifiers 2 and 30 only need to have low gains should enable a high speed amplifying circuit to be formed.

Although the example described above refer to the various transistors as being n-conductivity IGFETS, it may also be possible to form the amplifying circuit shown in FIG. 5 using npn bipolar transistors. Also, the present invention could, of course, be used in circumstances where only p-channel IGFETS or pnp bipolar transistors are available. In addition, the present invention may also have advantages where CMOS circuitry is possible because it enables high speed operation by allowing the use of low gain amplifiers to form a high gain high performance amplifying circuit.

From reading the present disclosure, other modifications and variations will be apparent to persons skilled in the art. Such modifications and variations may involve other features which are already known in the art and which may be used instead of or in addition to features already described herein. Although claims have been formulated in this application to particular combinations of features, it should be understood that the scope of the disclosure of the present application also includes any novel feature or combination of features disclosed herein either explicitly or implicitly, whether or not relating to the same invention as presently claimed in any claim and whether or not it mitigates any or all of the same technical problems as does the presently claimed invention.

I claim:

1. An amplifying circuit comprising: an amplifier having positive and negative inputs and an output and means providing a high input impedance path for feeding from the negative input to the output of the amplifier a first voltage equal to a second voltage at the positive input of the amplifier multiplied by the reciprocal of the open loop gain of the amplifier.

2. An amplifying circuit according to claim 1, wherein the feeding means comprises a further amplifier having positive and negative inputs and an output with the positive input being coupled to the positive input of the amplifier and the negative input being coupled to the output of the further amplifier which is coupled via coupling means to supply the first voltage to the output of the amplifier.

3. An amplifying circuit according to claim 2, wherein the amplifier has an open loop gain of 2 and the further amplifier has an open loop gain of 1.

4. An amplifying circuit according to claim 3, wherein the coupling means comprises first and second matched transistors each having first and second main electrodes and a control electrode with the main current paths between the first and second main electrodes of the first and second transistors being coupled in series, the control electrode of the first transistor being coupled to the output of the further amplifier and the control electrode of the second transistor being coupled to the output of the amplifier.

5. An amplifying circuit according to claim 2, wherein the coupling means comprises first and second matched transistors each having first and second main electrodes and a control electrode with the main current paths between the first and second main electrodes of the first and second transistors being coupled in series, the control electrode of the first transistor being coupled to the output of the further amplifier and the control electrode of the second transistor being coupled to the output of the amplifier.

6. An amplifying circuit according to claim 5, wherein each amplifier comprises a single stage long tailed pair.

7. An amplifying circuit according to claim 2, wherein each amplifier comprises a single stage amplifier.

8. An amplifying circuit according to claim 2, wherein each amplifier comprises a single stage long tailed pair.

9. An amplifying circuit according to claim 8, wherein each amplifier comprises a first arm having a first input transistor having a first main electrode coupled via a first load to a first voltage supply line, a second main electrode and a control electrode coupled to the positive input of the amplifier and a second arm having a second input transistor having a first main electrode coupled via a second load to the first voltage supply line, a second main electrode and a control electrode coupled to the negative input of the amplifier, the second main electrodes of the input transistors being coupled to one of the first and second main electrodes of a bias transistor having its other main electrode coupled to a second voltage supply line and its control electrode coupled to a bias voltage supply line, the output of the amplifier being coupled between the load and the first main electrode of the second input transistor.

10. An amplifying circuit according to claim 9, wherein the first and second loads comprise diode-connected transistors.

11. An amplifying circuit according to claim 2 formed using only n-channel insulated gate field effect transistors.

12. An amplifying circuit according to claim 2 formed as a thin film integrated circuit.

13. An amplifying circuit according to claim 2, wherein the amplifier and the further amplifier comprise transistors all of the same conductivity type.

14. An amplifying circuit according to claim 2, wherein k is a scaling factor equal to the reciprocal of the open loop gain $A_{OL}$ of the amplifier, i.e. $k=1/A_{OL}$ and the open loop gain of the further amplifier is $A'_{OL}$ where $A'_{OL}=k/1-k$.

15. An amplifying circuit according to claim 2, wherein the amplifier and the further amplifier are each low gain amplifiers in which the open loop gain of the amplifier is 2 and the open loop gain of the further amplifier is 1.

16. An amplifying circuit according to claim 1, wherein the amplifier comprises a single stage amplifier.

17. An amplifying circuit according to claim 1, wherein the amplifier comprises a single stage long tailed pair.

18. An amplifying circuit according to claim 17, wherein the amplifier comprises a first arm having a first input transistor having a first main electrode coupled via a first load to a first voltage supply line, a second main electrode and a control electrode coupled to the positive input of the amplifier and a second arm having a second input transistor having a first main electrode coupled via a second load to the first voltage supply line, a second main electrode and a control electrode coupled to the negative input of the amplifier, the second main electrodes of the input transistors being coupled to one of the first and second main electrodes of a bias transistor having its other main electrode coupled to a second voltage supply line and its control electrode coupled to a bias voltage supply line, the output of the amplifier being coupled between the load and the first main electrode of the second input transistor.

19. An amplifying circuit according to claim 1, wherein the output voltage, $V_{out}$, at the output of the amplifier is $$V_{out} = \frac{A_{OL}V^+(1+k)}{(1+A_{OL})}$$

where $A_{OL}$ is the open loop gain of the amplifier, $V^+$ is the second voltage at the positive input of the amplifier and k is a value selected to provide a desired ratio between the output voltage ($V_{out}$), and the input voltage $V^+$.

20. An amplifying circuit according to claim 19, wherein $K=1/A_{OL}$ to provide a unity gain amplifying circuit.

* * * * *